United States Patent
Akram

(10) Patent No.: US 6,960,924 B2
(45) Date of Patent: Nov. 1, 2005

(54) ELECTRICAL CONTACT

(75) Inventor: Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 7 days.

(21) Appl. No.: 10/423,125

(22) Filed: Apr. 25, 2003

(65) Prior Publication Data

US 2003/0206029 A1 Nov. 6, 2003

Related U.S. Application Data

(62) Division of application No. 09/387,987, filed on Sep. 1, 1999, now Pat. No. 6,556,030.

(51) Int. Cl.$^7$ ................................................ G01R 31/02
(52) U.S. Cl. ........................................ 324/754; 324/765
(58) Field of Search ................................. 324/754–755, 324/761, 765; 438/14, 17–18; 257/40, 48, 739

(56) References Cited

U.S. PATENT DOCUMENTS

| | | | |
|---|---|---|---|
| 4,790,779 A | 12/1988 | Billman et al. | |
| 4,926,117 A | 5/1990 | Nevill | |
| 4,937,653 A | * 6/1990 | Blonder et al. | ............. 257/739 |
| 5,177,439 A | 1/1993 | Liu et al. | |
| 5,326,428 A | 7/1994 | Farnworth et al. | |
| 5,375,320 A | 12/1994 | Kinsman et al. | |
| 5,419,807 A | 5/1995 | Akram et al. | |
| 5,478,779 A | 12/1995 | Akram | |
| 5,483,741 A | 1/1996 | Akram et al. | |
| 5,592,736 A | 1/1997 | Akram et al. | |
| 5,607,818 A | 3/1997 | Akram et al. | |
| 5,629,630 A | 5/1997 | Thompson et al. | |
| 5,686,317 A | 11/1997 | Akram et al. | |
| 5,742,169 A | 4/1998 | Akram et al. | |
| 5,783,461 A | 7/1998 | Hembree | |
| 5,815,000 A | 9/1998 | Farnworth et al. | |
| 5,834,945 A | 11/1998 | Akram et al. | |
| 5,838,161 A | 11/1998 | Akram et al. | |
| 5,869,974 A | 2/1999 | Akram et al. | |
| 5,894,161 A | 4/1999 | Akram et al. | |
| 5,897,368 A | 4/1999 | Cole, Jr. et al. | |
| 5,903,443 A | 5/1999 | Schoenfeld et al. | |
| 5,915,977 A | 6/1999 | Hembree et al. | |
| 5,952,840 A | 9/1999 | Farnworth et al. | |
| 5,962,921 A | 10/1999 | Farnworth et al. | |
| 5,982,185 A | 11/1999 | Farnworth | |
| 6,025,731 A | 2/2000 | Hembree et al. | |
| 6,028,436 A | 2/2000 | Akram et al. | |
| 6,033,982 A | 3/2000 | Lopatin et al. | |
| 6,040,239 A | 3/2000 | Akram et al. | |

(Continued)

OTHER PUBLICATIONS

Graphic of Die Packages Known In the Art, Apr. 1999.

*Primary Examiner*—Minh N. Tang
(74) *Attorney, Agent, or Firm*—TraskBritt

(57) ABSTRACT

In a test system, a silicon interconnect is provided that can accommodate a packaged part, such as a Land Grid Array (LGA) package. The interconnect can be made by etching a silicon substrate to form projections therefrom; forming an insulation or passivation layer through deposition or growth; depositing a seed layer over the insulation layer; depositing a metal layer over the seed layer; and etching contact members from the seed and metal layers using a single mask step. In a preferred embodiment, the metal layer is coated with another metal layer that matches the metal of the packaged part's electrical communication nodes. In one embodiment, the contact surfaces of the silicon contact are plated in gold and are planar. Included within the scope of the current invention are at least one method of testing an LGA package and at least one method of allowing electrical communication with a packaged part.

11 Claims, 10 Drawing Sheets

U.S. PATENT DOCUMENTS

| | | |
|---|---|---|
| 6,078,186 A | 6/2000 | Hembree et al. |
| 6,103,613 A | 8/2000 | Akram |
| 6,107,109 A | 8/2000 | Akram et al. |
| 6,130,148 A | 10/2000 | Farnworth et al. |
| 6,222,280 B1 | 4/2001 | Akram et al. |
| 6,246,246 B1 | 6/2001 | Hembree |
| 6,285,201 B1 | 9/2001 | Farnworth et al. |
| 6,310,484 B1 | 10/2001 | Akram et al. |
| 6,329,829 B1 | 12/2001 | Farnworth et al. |
| 6,365,967 B1 | 4/2002 | Akram et al. |
| 6,369,600 B2 | 4/2002 | Farnworth et al. |
| 6,556,030 B1 | 4/2003 | Akram |

* cited by examiner

ELECTRICAL CONTACT

CROSS-REFERENCE TO RELATED APPLICATION

This application is a divisional of application Ser. No. 09/387,987, filed Sep. 1, 1999, now U.S. Pat. No. 6,556,030, issued Apr. 29, 2003.

BACKGROUND OF THE INVENTION

1. Technical Field

The present invention relates generally to a device and method for providing electrical communication with a packaged integrated circuit device. More specifically, the present invention concerns a silicon interconnect and a method for fabricating a silicon interconnect for a Land Grid Array package.

2. State of the Art

In testing a semiconductor die, it is often useful to establish an electrical connection between the test equipment and the circuitry of a die. Testing may be performed on an unpackaged die that has been singulated from a semiconductor wafer, on a section of dice that is still part of the wafer, or on all of the dice on a wafer. In order to test a singular die, a partial wafer, or a full wafer, it may be beneficial to house the die structure in a temporary package such as a socket. The socket is configured to attach to a board which, in turn, is coupled to the test circuitry. One way to establish electrical communication between the die's bond pads and the socket is through the use of an interconnect. The interconnect is often made of silicon or some other etchable material, which may be coated with a conductive material to aid in electrical communication. The use of etchable materials such as silicon allows for the use of semiconductor fabrication techniques to form electrical contact members from a silicon substrate. Such techniques enable formation of electrical contact members at a pitch matching that of the die's bond pads. Silicon interconnects accommodate dice in other ways as well. For example, it is noteworthy that a die's bond pads are often made of aluminum. Given the temperatures associated with certain tests, it is important that the outermost coating of the interconnect be of some material other than aluminum; otherwise, the interconnect will permanently weld to the die during testing. Thus, it is taught in the art to coat a silicon interconnect with a material that is different from the material it will temporarily contact. Moreover, aluminum oxidizes relatively easily and, as a result, a die's aluminum bond pads are often covered with a thin film of nonconductive aluminum oxide. An interconnect must penetrate this oxide to reach the conductive aluminum of the bond pad in order to establish good electrical contact. To achieve this, it is taught to include fabrication steps that provide penetrating elements, such as blades, on the top of each interconnect contact. Steps that provide such elements are addressed in more detail in U.S. Pat. Nos. 5,326,428 and 5,419,807. These elements, while considered to be an improvement over flat contacts to a die's bond pads (see, for example, U.S. Pat. No. 5,607,818), necessarily cause damage to the bond pads and may shorten their useful life. Moreover, there is a risk that the elements will break off of the interconnect's contact.

These fabrication steps result in an interconnect that is configured to be inserted into the socket, receive a die's bond pads therein, and connect them to electrical terminals of the socket. Given the material of the interconnect and its placement in the package, such an interconnect is often referred to as a "silicon insert." The die is placed in the socket so that the die's bond pads are aligned with the interconnect's contact members; the socket is attached to the board; the board is coupled to the test circuitry; and testing commences.

After testing, the die may be removed from the socket. The interconnect may be removed as well, perhaps to be replaced by another interconnect having a different arrangement of contact members for another die. Dice that do not pass testing may be discarded, while those that do pass may undergo further processing, such as a burn-in process, and packaging.

Concerning the packaging of a die, there are varying degrees and types of packaging that a die may undergo. For example, a die may be configured as a "flip chip," wherein conductive material such as solder balls is attached directly to the bond pads or electrical traces formed in the surface of the die; the die is then "flipped," or mounted face down, so that the solder balls may connect with contact members of another device, such as a carrier substrate. Another example is a "chip scale package," which includes a die along with one or more minimal package elements, such as an encapsulating material in the form of a thin protective coating formed of glass or other materials. Such a coating may be bonded at least to the active surface of the die and edges thereof and sometimes to the sides and back side of the die as well. In addition, solder balls may be attached to electrical traces in the surface of the die or directly to the die's bond pads through openings in the encapsulating material in order to provide the aforementioned "flip chip" configuration. A Ball Grid Array (BGA) package serves as yet another example that involves even more packaging: the die is wire bonded to a substrate and encapsulated, and an array of solder balls on one side of the substrate is bonded to electrical traces leading through the substrate to the die. Alternatively, the package may comprise a Land Grid Array (LGA), which is similar to a BGA, except that flat contact pads—or lands—serve as external electrical communication nodes on the substrate instead of solder balls. Similarly, if an array of pins serves as the external electrical communication nodes for the package, such a package is known as a Pin Grid Array (PGA).

Other types of packages known in the art include dual in-line packages (DIP), wherein the leads extending from the package define two lines. Zigzag in-line packages (ZIP) have a line of leads, wherein every other lead extends into one of two planes (see U.S. Pat. No. 4,790,779). Leadless chip carrier (LCC) packages use sockets or conductive pads in place of leads and are configured to directly connect to a circuit board (see U.S. Pat. No. 5,375,320). Small outline packages (SOP) and thin small outline packages (TSOP) use a plastic ring around the package to contact the far end of the leads extending straight from two opposing edges of the package. The plastic ring can be removed after testing, and the leads may then be bent as needed. Quad flat pack (QFP) packages are similar to the SOPs in that a plastic ring surrounds the package and contacts the far end of the leads. In the QFP, however, the leads extend from four sides of the package (see also FIG. 6 of U.S. Pat. No. 5,903,443). Small outline j-bend (SOJ) packages use leads bent in a "j" shape, which allows for resiliency once the packages are attached to a circuit board.

As for testing these packaged dice, current methods of doing so also have problems. For example, testing LGA packages involves contacting the lands of the LGA with pins that have been stamped from a metal sheet. Each pin is placed within a hole that is one of an array of holes found within a plastic mold. This mold keeps an array of pins aligned with the package's array of lands. Test equipment may then access the lands through these pins. Unfortunately, there are several problems with using such pins. First, as the overall size of packages becomes smaller, the area of the lands decreases, as does the space between the lands. It is difficult for the stamped pins/plastic mold formation process to match the rate at which die packages are shrinking. In addition, using such pins often results in high inductance, thereby interfering with testing. Moreover, as with the silicon interconnects and the die bond pads, there exists the risk of a scrubbing action of the pins against the lands, which could damage both the pins and the lands.

Thus, there is a need in the art for improved testing structures and methods, including a need for improved temporary packaging for testing dice that have already undergone some degree of packaging. Included within this need is the desire to establish electrical communication between an interconnect and a related packaged die. Further, there is a more general need for improved electrical communication with a die, whether such communication is with a die as part of a permanently packaged part or a temporarily packaged part, or whether such communication is for test or non-test purposes.

BRIEF SUMMARY OF THE INVENTION

Accordingly, the current invention provides an electrical connector and a method of forming it. Many exemplary embodiments of the current invention apply semiconductor fabrication techniques to an interconnect for a packaged part while reducing if not eliminating the problems attendant with prior silicon interconnects and prior interconnects for packaged parts. Such embodiments involve forming silicon interconnects having a contact surface that is complementary to the electrical contact surface of the packaged part to be tested. In some embodiments, such as those configured to contact LGA packages, the interconnect's contact surface is planar and parallel to the packaged part's contact surface. In more general embodiments, the interconnect's contacts are non-invasive or non-penetrating with respect to the electrical contacts of the packaged part. Some of these embodiments may be described as defining "male-female" configurations between the interconnect's contact surface and that of the packaged part.

An exemplary method of fabricating interconnects such as the ones described above involve defining a projection or protrusion from a substrate; providing a passivation/insulation layer over the substrate, including the projection; providing at least one seed layer over the passivation/insulation layer; providing at least one metal layer over the seed layer; and simultaneously patterning the metal layer and seed layer. In a preferred embodiment, the metal layer of the interconnect is the same metal as the packaged part's contact points.

DETAILED DESCRIPTION OF THE INVENTION

Figure 1:
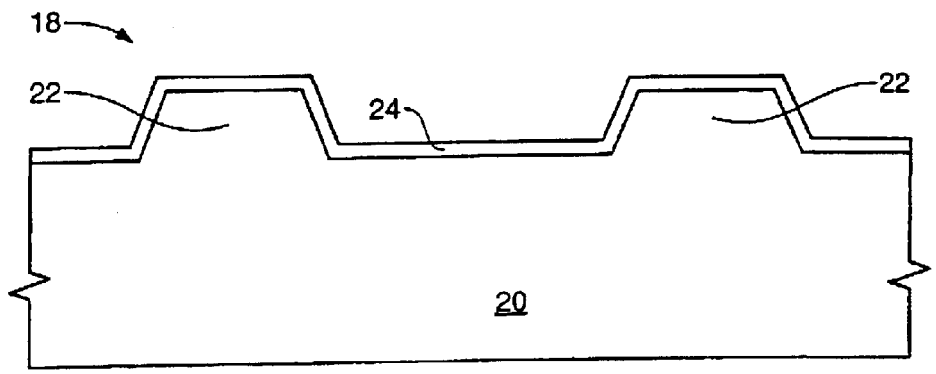
FIG. 1 depicts two in-process electrical connectors having undergone processes known in the prior art.

FIG. 1 depicts two in-process contact members—ones in the process of being formed—having undergone steps known in the art. For purposes of explanation, it is assumed that these contact members are part of an in-process interconnect device 18, although the current invention includes within its scope an electrical contact and methods of forming an electrical contact in other contexts. A substrate 20 has been provided. In the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above. Preferably, the substrate 20 comprises an etchable material such as silicon, germanium, silicon-on-glass or silicon-on-sapphire. The substrate 20 can also be formed of ceramic. In addition, the substrate 20 can be formed of a photosensitive glass, or glass-ceramic material, such as "FOTOFORM" manufactured by Corning.

FIG. 1 further indicates that a patterned mask layer, such as a nitride layer, was provided over the substrate 20, and an anisotropic etch was subsequently performed, thereby forming two projections 22 from the remaining substrate 20. This etch can be a wet etch, wherein the substrate is exposed to a mixture of $KOH:H_2O$ (40% KOH by volume) at about 70° C. A representative height of projections 22 can range from 25–100 microns, and a representative width on each side can be from 40–100 microns. Moreover, FIG. 1 illustrates that a passivation/insulation layer 24 is provided over the projections 22 and the remaining substrate 20. This layer 24 can be an oxide, either grown or deposited, or some other dielectric material, such as $Si_3N_4$ or polyimide. Growing an oxide, for example, might involve exposing the in-process interconnect device 18 to an $O_2/H_2O$ environment at a temperature of 900° C. or greater. Depositing oxide can be accomplished through chemical vapor deposition (CVD) using tetraethylorthosilane (TEOS) at a temperature of about 400° C. Alternatively, a layer of $Si_3N_4$ may be provided through CVD. An exemplary thickness of this layer may range from 500 angstroms to 2 microns.

Figure 2:
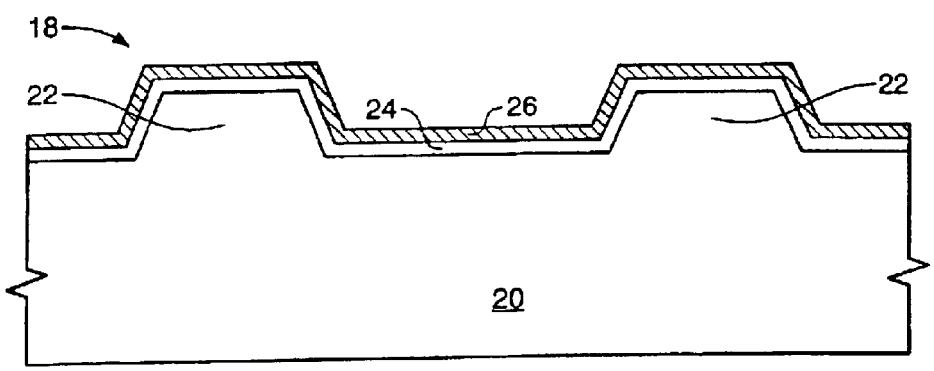
FIG. 2 illustrates two in-process electrical connectors having undergone a step included within an exemplary embodiment of the current invention.

A subsequent exemplary step within the scope of the current invention is illustrated in FIG. 2. That figure indicates that at least one seed layer 26 is deposited over the passivation/insulation layer 24. This seed layer 26 can be blanket deposited so that it conforms to the substrate 20 including its non-planar topography, thereby covering each projection 22, including the sidewalls and top thereof. This seed layer 26 provides nucleation sites for any subsequently deposited layer (in this exemplary embodiment, there will be a subsequently deposited metal layer). Moreover, this layer may also serve to help the subsequently deposited layer adhere to the in-process device as well as act as a barrier layer—preventing material from migrating from one side of the layer to the other. Exemplary materials for this seed layer 26 include tungsten, aluminum, copper, titanium nitride, and combinations thereof. General methods of depositing these seed layers are known in the art. For example, a tungsten layer may be sputtered onto the passivation/insulation layer 24 using a tungsten target and an argon source, and having a substrate temperature of about 250° C., an ambient temperature of about 200° C., and a low pressure, such as one ranging from 0.01 millitorr to $1 \times 10^{-6}$ torr. Layers of the other materials may be sputtered under similar conditions with the appropriate target material. Sputtering titanium nitride may be accomplished using a titanium target and introducing nitrogen gas along with or after the argon source gas. As an exemplary range, this seed layer 26 can be 200 to 1000 angstroms thick.

As mentioned above and depicted in FIG. 3, at least one metal layer 28 is subsequently deposited over the seed layer 26. As with the seed layer 26, this metal layer 28 can be conformably blanket deposited. The metal layer 28 can comprise a selection of copper, gold, palladium, chromium, or alloys thereof, such as chromium-copper. While exemplary embodiments of the current invention include those having multiple metal layers, it is preferred that the metal layer configured to contact the package to be tested be of the same material used for the package's electrical contact nodes. Assuming for example, that an LGA package is to be tested using this interconnect device 18, it should be noted that the lands of an LGA are often made of gold. Accordingly, in one exemplary embodiment, the metal layer 28 should also be gold. Depositing the metal layer 28 can be accomplished through sputtering, electroplating, or other methods for depositing metals known in the art. As an exemplary range, this metal layer 28 can be 500 angstroms to 4 microns thick.

A patterned mask layer is then provided over the metal layer 28. The metal layer 28 and seed layer 26 are etched according to the patterned mask, and the result appears in FIG. 4. Specifically, the contact members 30 are electrically isolated from one another. The etch also defines a conductive trace 32 and a connection pad 34 for at least one if not all of the contact members 30.

Figure 4:
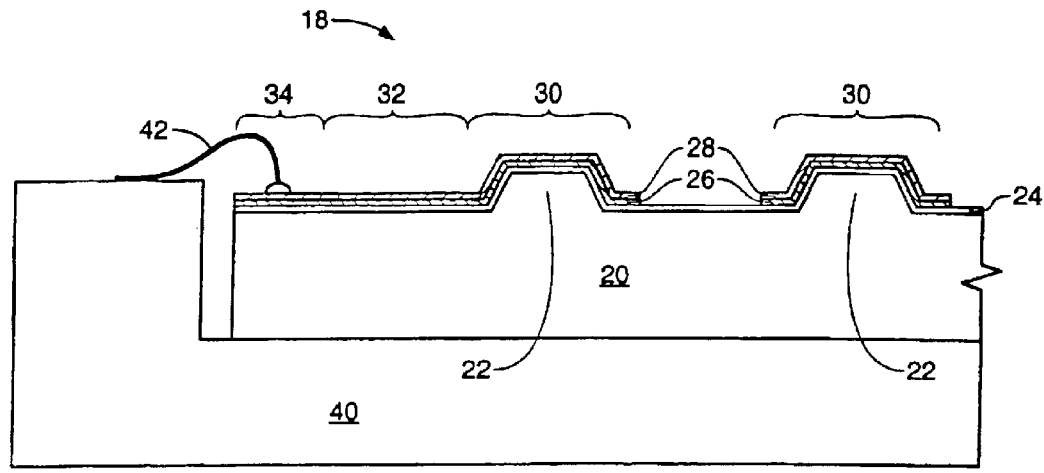
FIG. 4 illustrates two in-process electrical connectors having undergone yet another step included within an exemplary embodiment of the current invention, as well as a cross-sectional view of a first exemplary apparatus embodiment of the current invention.
Figure 5:
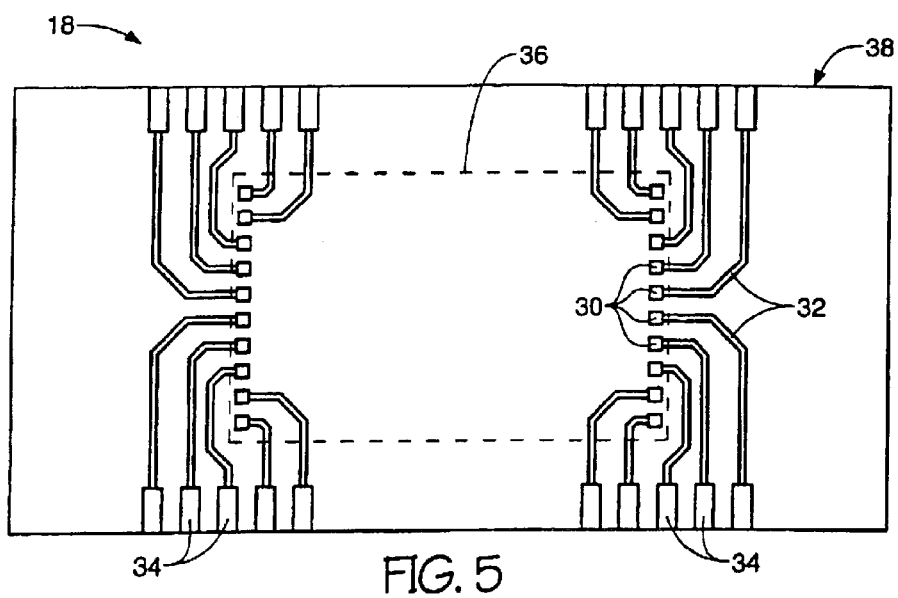
FIG. 5 illustrates a top-down view of the first exemplary apparatus embodiment of the current invention.

The conductive traces 32 and connection pads 34 are more easily distinguished in FIG. 5, illustrating a top-down view of an interconnect device 18. This figure specifically depicts a silicon insert 38 configured to be inserted into a socket and receive the nodes or members establishing electrical contact or communication with the packaged die for testing. Again, for purposes of explanation, it will be assumed that the package being tested is an LGA package. This view demonstrates that the contact members 30 are formed in places on the silicon insert 38 that correspond to the lands of the LGA package to be tested. The dashed line 36 defines the site of the LGA package during testing. It should be further noted that the lands of an LGA packaged die are not necessarily limited to the periphery. An LGA packaged die may contain more centrally located lands, and a silicon insert within the scope of the current invention can have contact members arranged accordingly and having a pitch or spacing matching that of the lands of the LGA package. The conductive traces 32 lead from the contact members 30 to the connection pads 34 which, in this exemplary embodiment, are located on the sides of the silicon insert 38. Returning to FIG. 4, a connection pad 34 may then be electrically connected to a conductive portion of a socket 40 using a bond wire 42. An LGA package (not shown) may then be placed in the socket 40 in communication with the contact members 30. Testing may then commence as described above. The silicon insert 38 depicted in FIG. 5 has a rectangular periphery, with a size slightly larger than the LGA to which it will connect. Those skilled in the art, however, can now appreciate that the insert may have other configurations accommodating another LGA or other packages to be tested as well as accommodating the socket in which the insert will be placed.

Figure 6:
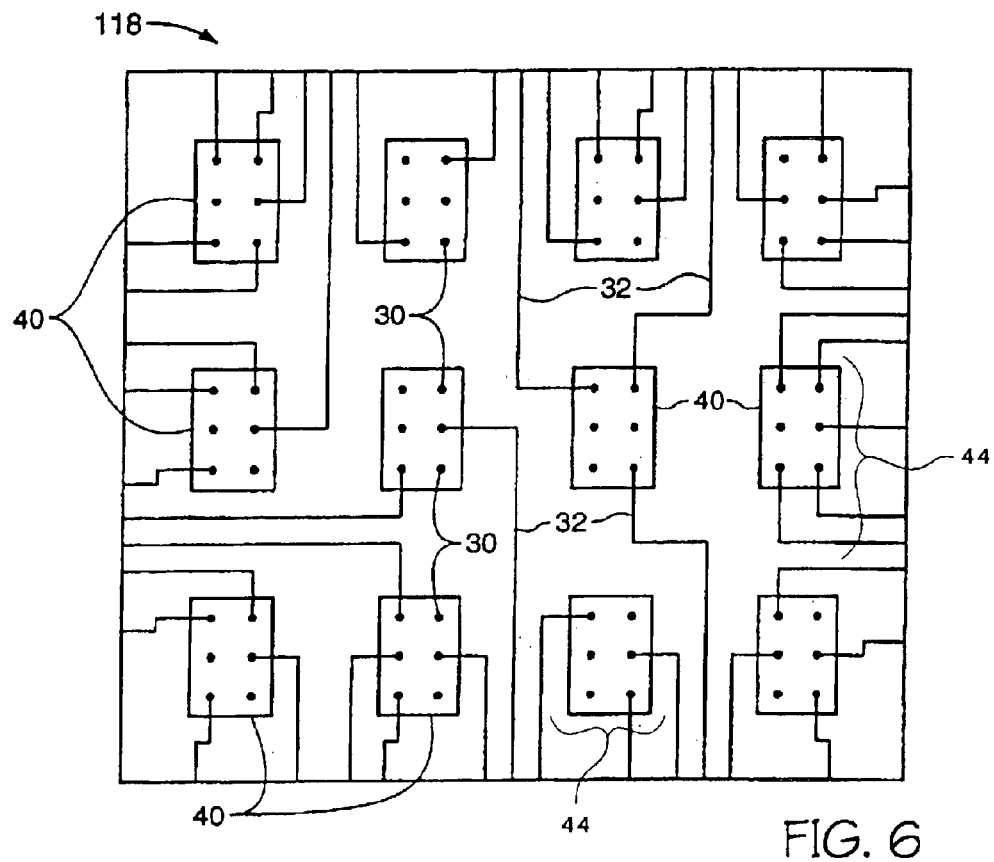
FIG. 6 illustrates a top-down view of a second exemplary apparatus embodiment of the current invention.
Figure 7:
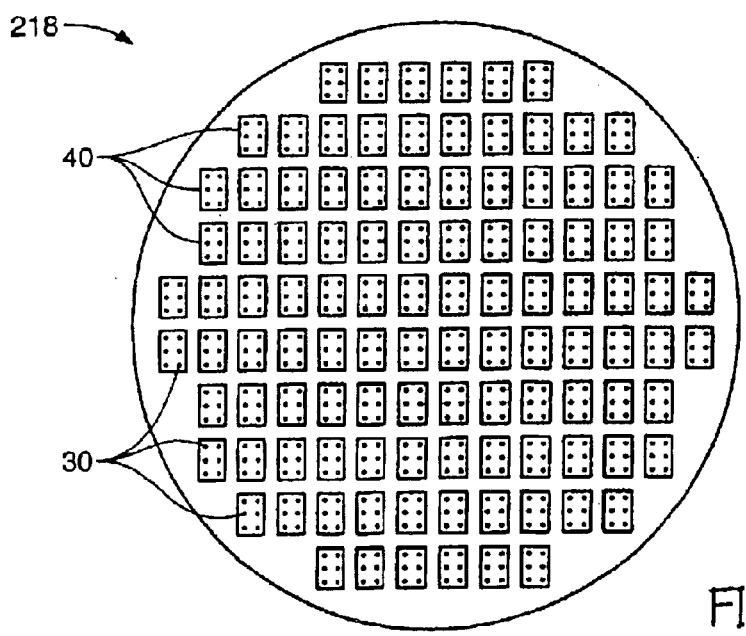
FIG. 7 illustrates a top-down view of a third exemplary apparatus embodiment of the current invention.

FIGS. 6 and 7 illustrate other configurations for an interconnect under the current invention. In FIG. 6, the interconnect 118 is configured to accommodate a group of dice, such as an array of dice that is on a semiconductor wafer. A pattern 44 of contact members 30 is provided for each die in the array to be tested. As in the embodiment in FIG. 5, a conductive trace 32 in FIG. 6 may lead from each contact member 30, although not all are shown for purposes of clarity. In FIG. 7, the interconnect 218 is configured to test all of the dice on a semiconductor wafer. Such configurations are further detailed in copending application Ser. No. 08/829,193.

Figure 3:
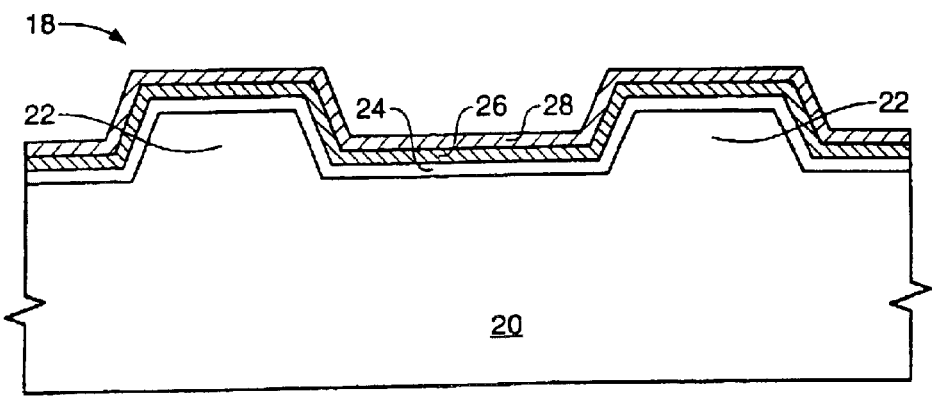
FIG. 3 illustrates two in-process electrical connectors having undergone another step included within an exemplary embodiment of the current invention.

One advantage of the method embodiment depicted in FIGS. 2 through 4 is that only one mask step is required—the one used to pattern the metal layer 28 and the seed layer 26. This is in addition to the mask step known in the art that is used to define the projections 22. Thus, in terms of the entire contact member-forming process, only two mask steps are used. This is beneficial, as additional mask steps require additional process time and expense.

Figure 8:
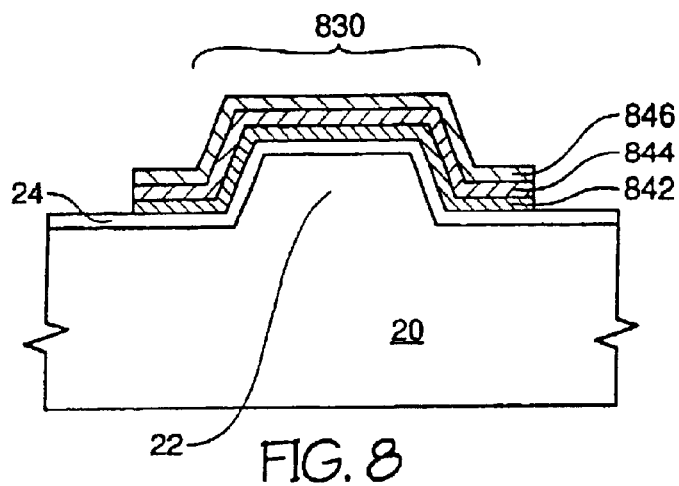
FIG. 8 illustrates a cross-sectional view of a fourth exemplary apparatus embodiment of the current invention.

Moreover, additional metal layers may be added without adding mask steps. Assuming that it is desirable to have a gold layer contact the packaged part being tested, it may not necessarily be desirable to have gold serving as the only layer over the seed layer. For instance, given the cost of gold, it may be preferable to deposit a different metal layer over the seed layer, wherein that layer serves as the main current-carrying layer, with a thinner plate of gold deposited thereover. In one such exemplary embodiment, the main current-carrying layer can be 500 angstroms to 4 microns thick, whereas the gold layer ranges from 200 angstroms to 1 micron in thickness. Further, a different metal layer may be able to adhere to the seed layer better than gold. Accordingly, embodiments having additional metal layers are exemplified in FIGS. 8–10. The contact member 830 achieved in FIG. 8 is the result of sputtering a tungsten layer 842 onto the passivation/insulation layer 24 overlying substrate 20 and projection 22, plating a copper layer 844 over the tungsten layer 842, and plating a gold layer 846 over the copper layer 844. One mask and etch step can then be used on all three layers 842–846 to define the contact member 830.

Figure 9:
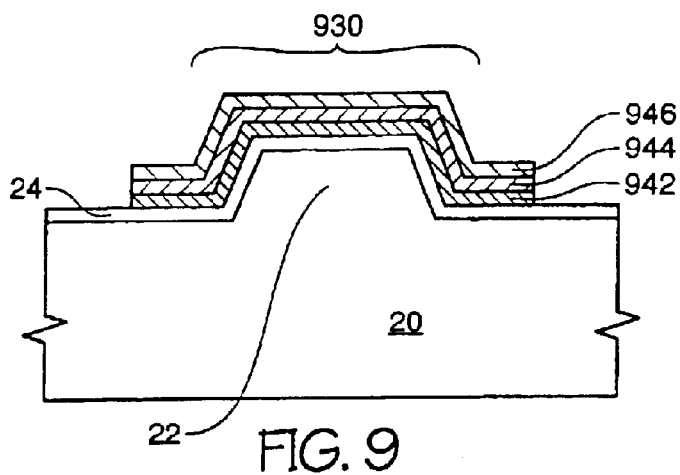
FIG. 9 illustrates a cross-sectional view of a fifth exemplary apparatus embodiment of the current invention.

Yet another exemplary embodiment appears in FIG. 9, wherein a titanium nitride layer 942 is sputtered onto the passivation/insulation layer 24 overlying substrate 20 and projection 22; a copper layer 944 is sputtered over the titanium nitride layer 942; and a gold layer 946 is plated over the copper layer 944. Once again, one mask and etch step can then be used on all three layers 942–946 to define the contact member 930.

Figure 10:
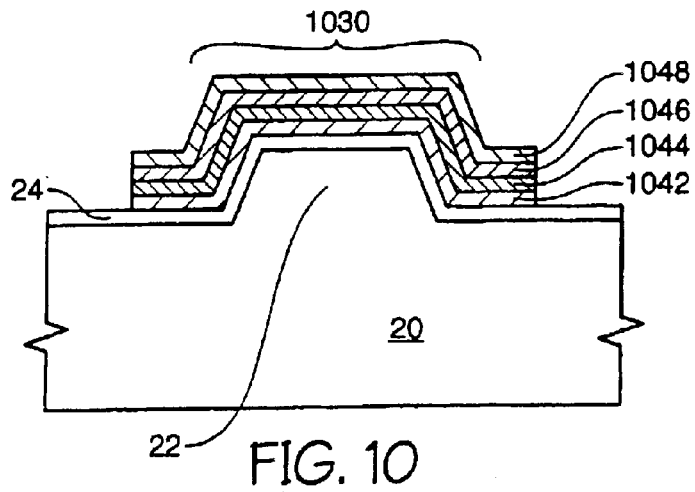
FIG. 10 illustrates a cross-sectional view of a sixth exemplary apparatus embodiment of the current invention.

FIG. 10 depicts still another exemplary embodiment. As a seed layer, an aluminum layer 1042 is sputtered onto the passivation/insulation layer 24 overlying substrate 20 and projection 22. This aluminum layer 1042, however, may have a tendency to oxidize. Hence, it is preferred in this embodiment to dip the in-process device into a zincate solution, which removes aluminum oxide that may have formed on the aluminum layer 1042. In addition, such a step results in an overlying zinc passivation layer 1044. Subsequently, the in-process device may be subjected to a nickel flash step, wherein the in-process device is briefly dipped into an electrolytic solution containing nickel, thereby creating a thin nickel layer 1046. A gold or palladium layer 1048 is then plated over the nickel layer 1046 to define contact member 1030.

Another mask-saving benefit of the exemplary embodiments discussed above is that additional masks are not used to form penetrating blades on the upper surfaces of the projections 22. In addition to allowing for a simpler fabrication process, these embodiments avoid the risk of a blade breaking off from one of the projections 22 in response to contact with the land of an LGA package. Moreover, these embodiments limit the damage done to the testing and tested devices more so than the bond-pad-penetrating blades of prior art silicon interconnects and the pins of prior packaged part testing equipment.

One skilled in the art can appreciate that, although specific embodiments of this invention have been described above for purposes of illustration, various modifications may be made without departing from the spirit and scope of the invention. For example, it is possible in one exemplary embodiment to retain the mask layer used to define the projections 22 seen in FIG. 1. That patterned layer, which can be $Si_3N_4$, can serve in whole or as part of the passivation/insulation layer 24. Retaining that layer saves the time and effort of removing that mask material and may quicken the process of providing a continuous passivation/insulation layer 24, if such continuity is desired. In addition, it is not required under the current invention to define the projections with an anisotropic etch; other exemplary embodiments include those wherein the projections result from an isotropic etch.

Figure 11:
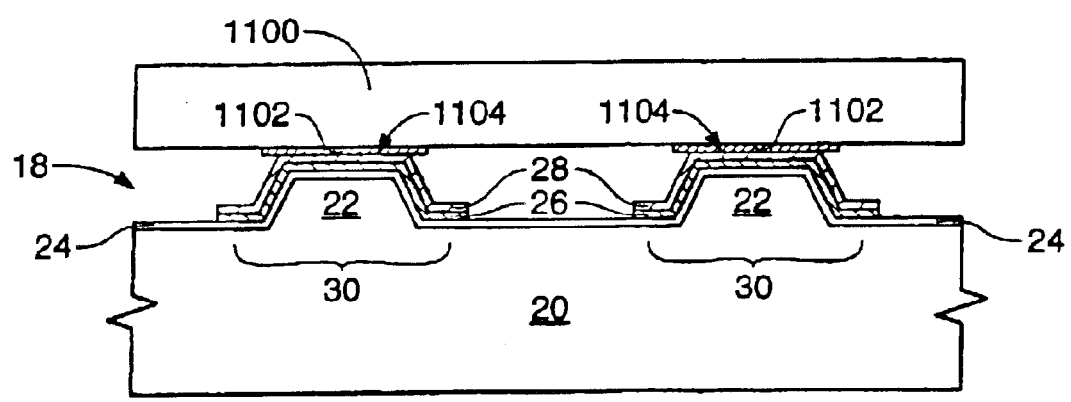
FIG. 11 shows an exemplary embodiment concerning the use of an electrical connector.
Figure 12A:
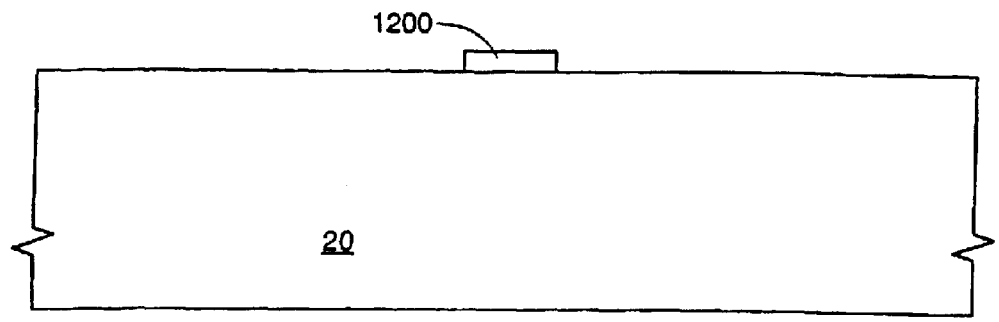
FIGS. 12A–E disclose an exemplary embodiment of the current invention.
Figure 12B:
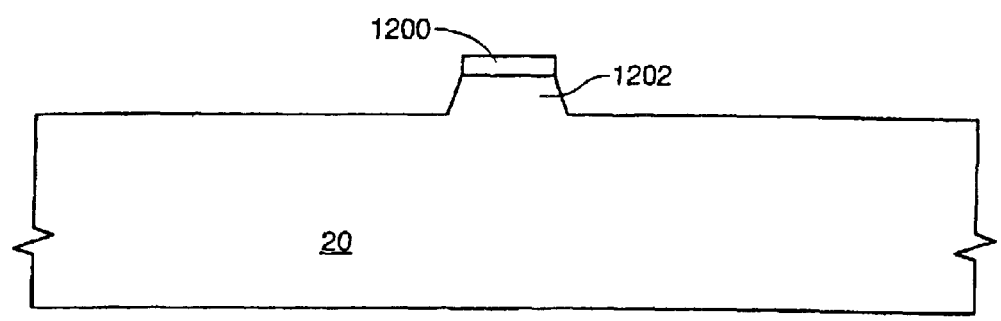
Figure 12C:
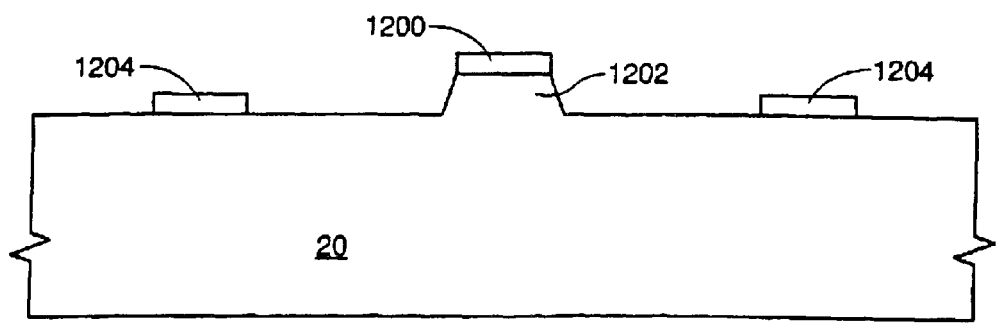
Figure 12D:
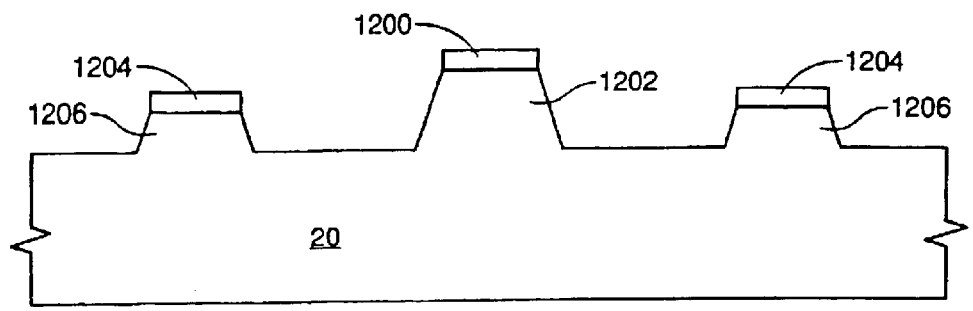
Figure 12E:
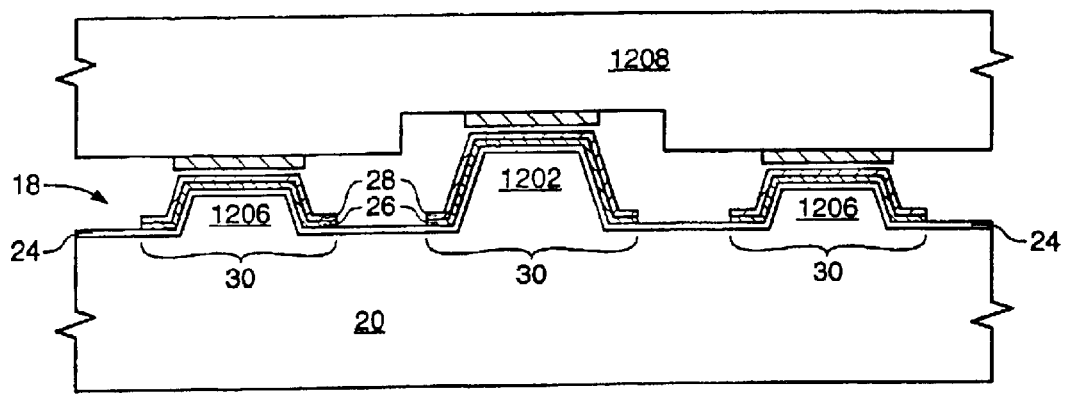

Moreover, the configuration of contact members may vary from the ones described above. FIG. 11 depicts the silicon interconnect device 18 that can result from the process described in FIGS. 1 through 4 and the relevant text. (Further, FIG. 11 serves as a simplified version of the other embodiments discussed above.) FIG. 11 illustrates the silicon interconnect device 18 contacting an LGA package 1100 at its lands 1102. Each contact member 30 has a generally planar contact surface 1104 configured to receive a land 1102. Further, in this embodiment, each contact surface 1104 is coplanar and parallel to its corresponding land 1102. It is not necessary, however, for all of the contact members 30 to extend to the same height. As seen in FIG. 12A, a patterned mask 1200 deposited over substrate 20 can be used to define the site of a first protrusion. A subsequent etching process known in the art can then be used to partially form the first protrusion 1202 (FIG. 12B). A second mask 1204 can be subsequently deposited and patterned to define at least one site for at least one additional protrusion (FIG. 12C—showing two such sites). Further etching forms protrusions 1206 and completes the formation of protrusion 1202 (FIG. 12D). Additional steps already discussed above can be used to provide a passivation/insulation layer 24, a seed layer 26, and at least one metal layer 28 (FIG. 12E). The result is an interconnect device 18 having contact members 30 of varying height. Such a configuration would be useful in testing a packaged part 1208 having a topography that also defines varying heights. For that matter, the interconnect device 18 in FIG. 12E would be useful in testing non-packaged parts as well.

Figure 13A:
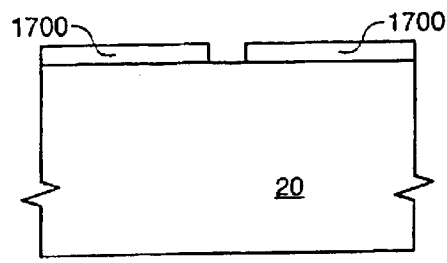
FIGS. 13A–E disclose an alternative exemplary embodiment of the current invention.
Figure 13B:
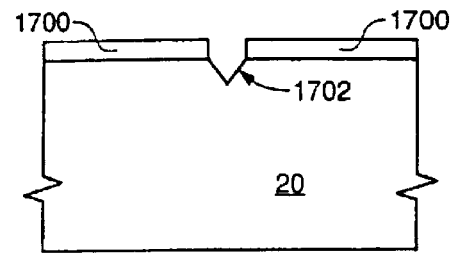
Figure 13C:
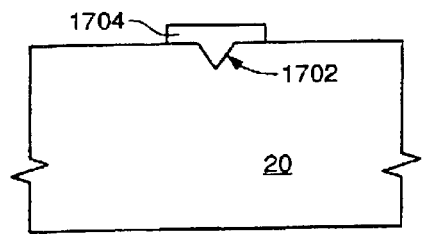
Figure 13D:
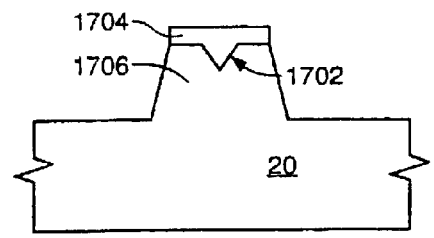
Figure 13E:
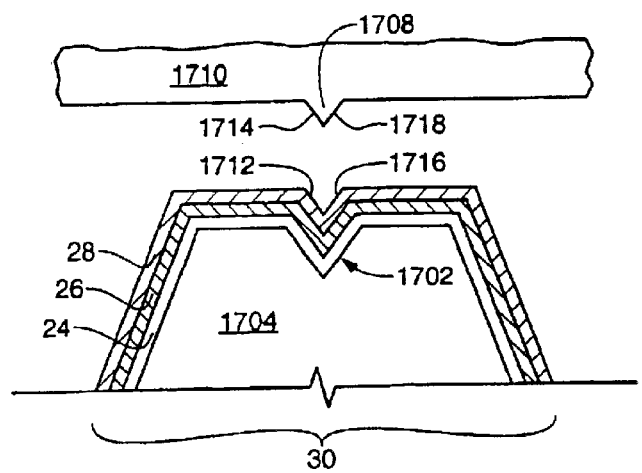

Furthermore, it is not necessary that the members have planar contact surfaces. Exemplary embodiments of the current invention also include those wherein the interconnect's contact members, while non-planar, nevertheless have portions that are configured to be parallel to corresponding portions of the packaged part's contact. An exemplary method embodiment capable of achieving such a configuration is illustrated beginning with FIG. 13A. That figure indicates that a mask 1700 is deposited over substrate 20 and patterned. A subsequent etch creates the recess 1702 seen in FIG. 13B. FIG. 13C illustrates that a second mask 1704 is deposited into, above, and beyond the recess 1702 and patterned to define a contact site. A protrusion 1706 is formed from substrate 20 by an etch guided by the second mask 1704. The result of this etch is pictured in FIG. 13D. Again as discussed above, a passivation/insulation layer 24, a seed layer 26, and at least one metal layer 28 can be subsequently provided. Such a contact configuration accommodates the electrical communication node 1708 of packaged part 1710 by complementing the surfaces of that node 1708. For instance, a first portion 1712 of the contact member 30 defines a slope from a horizontal plane that matches the slope of a first portion 1714 of node 1708. As a result, the two portions 1712 and 1714 are parallel. A second portion 1716 of contact member 30 complements a second portion 1718 of node 1708 in a similar manner. Given this configuration, package part node 1708 could be considered a "male" contact, while the accommodating interconnect contact member 30 could be considered to be the "female" counterpart.

Figure 14:
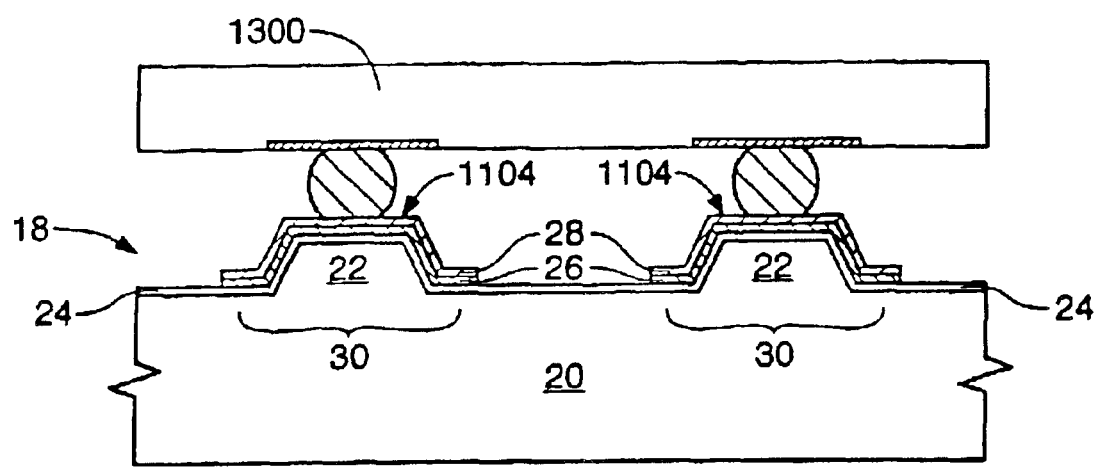
FIG. 14 shows another exemplary embodiment of the current invention.

Concerning the use of contact members, it should be noted that contact members such as the ones described above may be used in conjunction with packages other than an LGA package. For example, as shown in FIG. 14, a BGA package 1300 is electrically coupled to the interconnect device 18. It follows that embodiments of the current invention can accommodate other packages as well, including the packages mentioned above: dual in-line (DIP), zigzag in-line (ZIP), leadless chip carrier (LCC), small outline package (SOP), thin small outline package (TSOP), quad flat pack (QFP), small outline j-bend (SOJ), and pin grid array (PGA) packages in addition to bare die packages, chip scale packages, flip chip packages, and combinations thereof.

Figure 15:
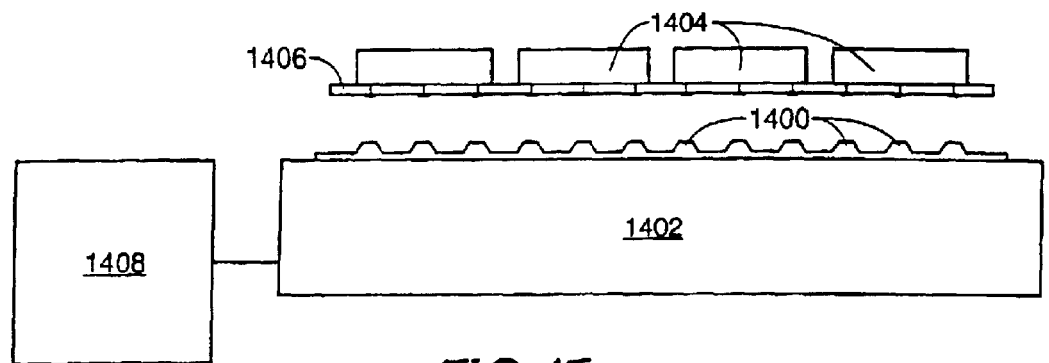
FIG. 15 shows yet another exemplary embodiment of the current invention.

Further, not only will the above-mentioned methods and devices work for silicon inserts and interconnects in general, but they have applications in other contexts as well. For example, FIG. 15 illustrates at least one electrical connector 1400, included within the scope of the current invention, that forms a part of a test head 1402. The test head 1402 is configured to allow electrical communication between the sockets 1404 of a carrier 1406 and test equipment 1408 through the electrical connectors 1400. The test equipment 1408 may include circuitry configured to transmit, receive, and in general analyze the performance of the device being tested. The electrical connectors 1400 can be formed by the methods disclosed above and used to form the contact members of a silicon insert. The electrical connectors 1400 can be dimensioned so that there is one electrical connector 1400 corresponding to every contact point on the carrier 1406. Under the methods disclosed above, it is possible in certain embodiments to provide electrical connectors 1400 having a contact surface made of the same material as the connections of the carrier 1406.

Figure 16:
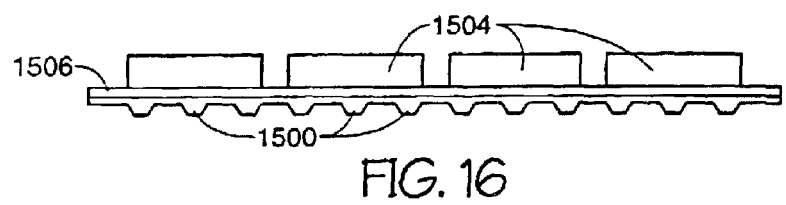
FIG. 16 shows still another exemplary embodiment of the current invention.

As an alternative to or in addition to the electrical connectors 1400 forming part of a test head, it may be desirable to include at least one electrical connector 1500 as part of a chip carrier 1506, as seen in FIG. 16. The chip carrier 1506 can be configured to allow electrical communication between each contact point of each socket 1504 to an electrical connector 1500. Once again, the electrical connectors 1500 can terminate with a material similar to the material to be contacted.

Figure 17:
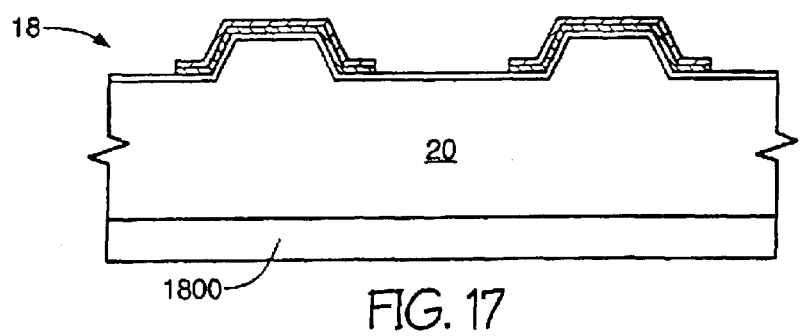
FIG. 17 depicts one more exemplary embodiment of the current invention.

Yet another alternative embodiment appears in FIG. 17, wherein the interconnect device 18 includes an elastomer 1800 deposited on the underside of the substrate 20. The elastomer 1800 allows for flexibility of movement of the interconnect device 18, which will help ensure good electrical connection in the event interconnect device 18 is subjected to an uneven biasing force.

Moreover, the methods and devices described above are not limited to testing circumstances; rather, they could also be used for interconnect devices in permanent or semipermanent packaging. Accordingly, the invention is not limited except as stated in the claims.

What is claimed is:

1. An electrical contact, comprising:
   at least one non-penetrating protrusion having a substantially planar top surface from a substrate;
   a passivation layer having a substantially planar surface portion located over the substantially planar top surface of the at least one non-penetrating protrusion;
   at least one seed layer having a substantially planar surface portion located over the substantially planar surface portion of the passivation layer; and
   at least one metal layer having a substantially planar surface portion located over the substantially planar surface portion of the at least one seed layer, the at least one metal layer configured to contact a portion of a device coated with a metal, the at least one metal layer comprising the metal coating the portion of the device.

2. The electrical contact of claim 1, wherein the at least one seed layer is made from a selection consisting of one of tungsten, aluminum, copper, titanium nitride, and combinations thereof.

3. The electrical contact of claim 2, wherein the at least one metal layer is made from a selection consisting of one of copper, gold, palladium, chromium, and alloys thereof.

4. A contact member located on a substrate, comprising:
   at least one non-penetrating substrate projection having a substantially planar top surface formed from the substrate;
   an insulation layer over the at least one non-penetrating substrate projection forming a substantially planar top surface; and
   at least two metal-containing layers over the insulation layer, comprising:
   a nucleation layer formed over the insulation layer, the nucleation layer having a substantially planar top surface, and
   a packaged part contact layer formed over the nucleation layer, the packaged part contact layer having a substantially planar top surface.

5. The contact member in claim 4, wherein the at least two metal-containing layers further comprise:
   a tungsten layer over the insulation layer;
   a copper layer over the tungsten layer; and
   a gold layer over the copper layer.

6. The contact member in claim 4, wherein the at least two metal-containing layers further comprise:
   a titanium nitride layer over the insulation layer;
   a copper layer over the titanium nitride layer; and
   a gold layer over the copper layer.

7. The contact member in claim 4, wherein the at least two metal-containing layers further comprise:
   an aluminum layer over the insulation layer;
   a zinc layer over the aluminum layer;
   a nickel layer over the zinc layer; and
   a gold layer over the nickel layer.

8. An insert for communicating with a device having a land grid array pitch, comprising:
   a substrate;
   a first non-penetrating projection having a substantially planar top surface extending from the substrate;
   a second non-penetrating projection having a substantially planar top surface extending from the substrate at a distance from the first non-penetrating projection, the second non-penetrating projection and the distance define an insert pitch commensurate with the land grid array pitch;
   an oxide having a substantially planar top surface portion over the first non-penetrating projection and the second non-penetrating projection and extending between the first non-penetrating projection and the second non-penetrating projection;
   a first contact surface having a substantially planar top surface portion over the oxide, at the first non-penetrating projection, and made of a metal;
   a first nucleation site between the first contact surface and the oxide;
   a second contact surface having a substantially planar top surface portion over the oxide, at the second non-penetrating projection, spaced from the first contact surface, and made of the metal; and
   a second nucleation site between the second contact surface and the oxide.

9. The insert in claim 8, wherein the first contact surface and the second contact surface are non-scrubbing surfaces.

10. The insert in claim 9, wherein the first contact surface and the second contact surface are free of penetrating projections thereon.

11. The insert in claim 8, wherein the first contact surface and the second contact surface are coplanar.

\* \* \* \* \*